Figure 1:
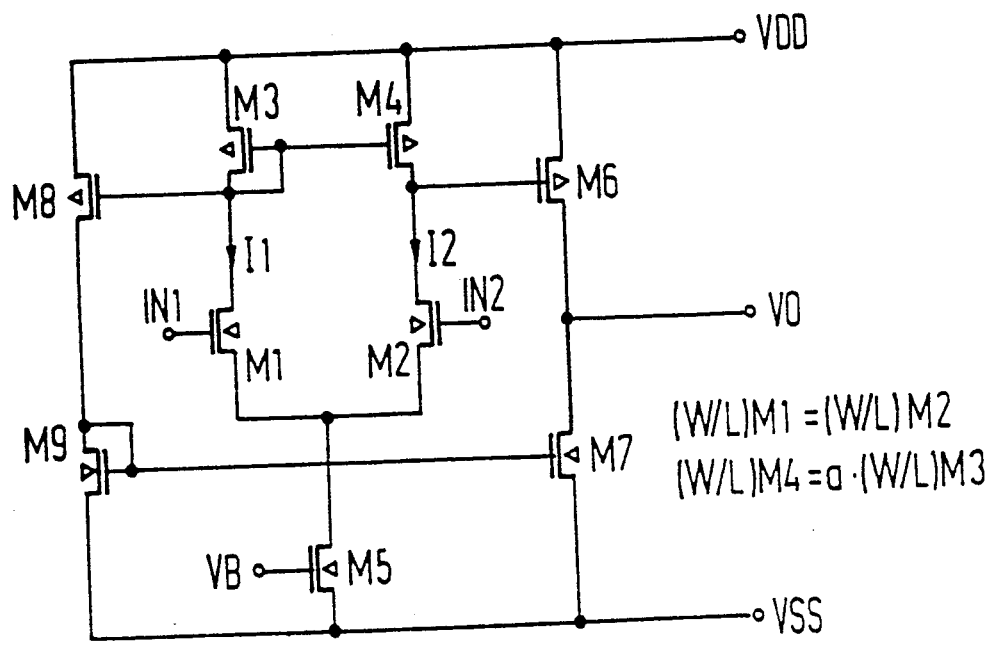

United States Patent [19]
Zitta

[11] Patent Number: 5,043,599
[45] Date of Patent: Aug. 27, 1991

[54] CMOS DIFFERENTIAL COMPARATOR WITH OFFSET VOLTAGE

[75] Inventor: Heinz Zitta, Drobollach, Austria

[73] Assignee: Siemens Aktiengesellschaft, Munich, Fed. Rep. of Germany

[21] Appl. No.: 412,895

[22] Filed: Sep. 26, 1989

[30] Foreign Application Priority Data

Sep. 26, 1988 [EP] European Pat. Off. ........ 88115835.6

[51] Int. Cl.$^5$ ............................................. H03K 5/24
[52] U.S. Cl. .................................. 307/355; 307/462; 307/494
[58] Field of Search ............... 307/350, 355, 362, 491, 307/494

[56] References Cited

U.S. PATENT DOCUMENTS

| | | | |
|---|---|---|---|
| 3,943,380 | 3/1976 | Morgan et al. ...................... | 307/362 |
| 4,047,059 | 9/1977 | Rosenthal . | |
| 4,511,810 | 4/1985 | Yukawa ............................... | 307/355 |
| 4,554,468 | 11/1985 | Rumbaugh et al. ................ | 307/355 |
| 4,598,215 | 7/1986 | Schechtman et al. .............. | 307/355 |
| 4,634,895 | 1/1987 | Luong ................................. | 307/350 |
| 4,658,157 | 4/1987 | McGowan . | |
| 4,754,169 | 6/1988 | Morris ................................ | 307/355 |

OTHER PUBLICATIONS

U.S. Publication IEEE Journal of Solid State Circuits, vol. SC-17, No. 6, Dec. 1982, New York, article "MOS Operational Amplifier Design —A Tutorial Overview", by Paul R. Gray et al., pp. 969–981.
U.S. Publication, SGS Power Supply Application Manual, 1985, p. 49 of Section "UC 1524A Integrated PWM Control".
German Democratic Republic Publication Radio, Fernsehen Elektronik, 27th Year, vol. 10 (1978-10) Berlin, article, "Grundschaltungen der analogen integrierten Technik", by H. E. Kröbel, pp. 621–625.
U.S. Publication AMK Berlin Congress and Convention Division, ICC Berlin Continuing Engineering Education Program, Seminar 713, Jun. 9–12, 1986, Prel. Edition of "CMOS Analog IC Design and CAD Techniques", by Ph. E. Allen, GA Inst. of Technology, pp. 352–356.

Primary Examiner—John Zazworsky
Attorney, Agent, or Firm—Herbert L. Lerner; Laurence A. Greenberg

[57] ABSTRACT

A circuit configuration in complementary MOS technology includes a comparator having two input transistors forming an input differential stage, a current source supplying the input transistors, first and second load transistors being driven by the input transistors, and an output. An output driver circuit has at least one first output transistor being controlled the output of the comparator, and a second output transistor complementary to the at least one first output transistor. The input transistors have symmetrical geometries and the load transistors have asymmetrical geometries generating a given operating characteristic of the comparator. The output driver circuit is geometrically adapted to the given operating characteristic.

5 Claims, 1 Drawing Sheet (W/L)M1 = (W/L)M2
(W/L)M4 = a·(W/L)M3

(W/L)M11 = (W/L)M12
(W/L)M14 = a·(W/L)M13

CMOS DIFFERENTIAL COMPARATOR WITH OFFSET VOLTAGE

The invention relates to a circuit configuration in complementary MOS technology, including a comparator in which two input transistors forming an input differential stage are supplied by a current source and drive a first and a second load transistor, and an output driver circuit which includes at least one output transistor controlled by the comparator output and its output complementary transistor.

In circuit applications, it is often necessary for a differential comparator to be switched over at a differential input voltage of more than 0 V between the input terminals. One known solution of the problem is additional circuitry of the comparator. For instance, a voltage source generating the desired offset voltage may be connected in series with an input terminal of the comparator. The SGS Power Supply Application Manual, 1985, page 49 describes a current limiting amplifier in the UC 1524 A chip that includes a bipolar comparator and in which the offset voltage is generated by a current source combined with a resistor R1. A further resistor is also necessary, in order to compensate for base currents.

The disadvantage of additional circuitry for the differential comparator used in order to attain the desired offset voltage is that additional components are required, and more current is consumed. On the other hand, the input transistors of the input differential stage of the differential comparator should be as symmetrical and as equal in surface area as possible, so that any error factors in the input differential stage can be kept as close to zero as possible.

It is accordingly an object of the invention to provide a CMOS differential comparator with impressed offset voltage, which overcomes the hereinafore-mentioned disadvantages of the heretofore-known devices of this general type, which needs no additional components and which minimizes current consumption.

With the foregoing and other objects in view there is provided, in accordance with the invention, a circuit configuration in complementary MOS technology, comprising a comparator including two input transistors forming an input differential stage, a current source supplying the input transistors, first and second load transistors being driven by the input transistors, and an output; and an output driver circuit including at least one first output transistor being controlled the output of the comparator, and a second output transistor complementary to the at least one first output transistor; the input transistors having symmetrical geometries and the load transistors having asymmetrical geometries generating a given operating characteristic of the comparator, and the output driver circuit being geometrically adapted to the given operating characteristic.

It is an advantage of the circuit configuration according to the invention that because the differential comparator is made by complementary MOS technology, the geometry of the transistors which are required on one hand can be set very precisely and accurately and on the other hand, precise values that can be calculated in advance for the impressed offset voltage are obtained thereby. It is also an advantage of the circuit configuration according to the invention that the differential comparator can be modulated to just below the supply voltage, and the circuit can therefore operate with a low supply voltage. The current consumption is kept minimal through the use of CMOS technology.

In accordance with another feature of the invention, the ratio of the geometrical quotients of the channel width and channel length of the input transistors is equal to 1, and the geometrical quotients of the channel width and channel length of the second load transistor associated with the output, with respect to the first load transistor is greater than 1.

In accordance with a further feature of the invention, the output driver circuit also includes a reference transistor corresponding to the at least one first output transistor, and a reference complementary transistor forming a current mirror with the second output transistor, and the geometrical quotient of the at least one first output transistor is equal to the product of the geometrical quotient of the reference transistor and the ratio of the geometrical quotients of the current mirror.

In accordance with a concomitant feature of the invention, the current source is formed of a transistor, the ratio of the geometrical quotient of the at least one first output transistor to the first load transistor is equal to the product of the ratio of the geometrical quotients of the second output transistor and the transistor forming the current source, and the ratio of the geometrical quotients of the second and the first load transistors, increased by one.

Other features which are considered as characteristic for the invention are set forth in the appended claims.

Although the invention is illustrated and described herein as embodied in a CMOS differential comparator with offset voltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
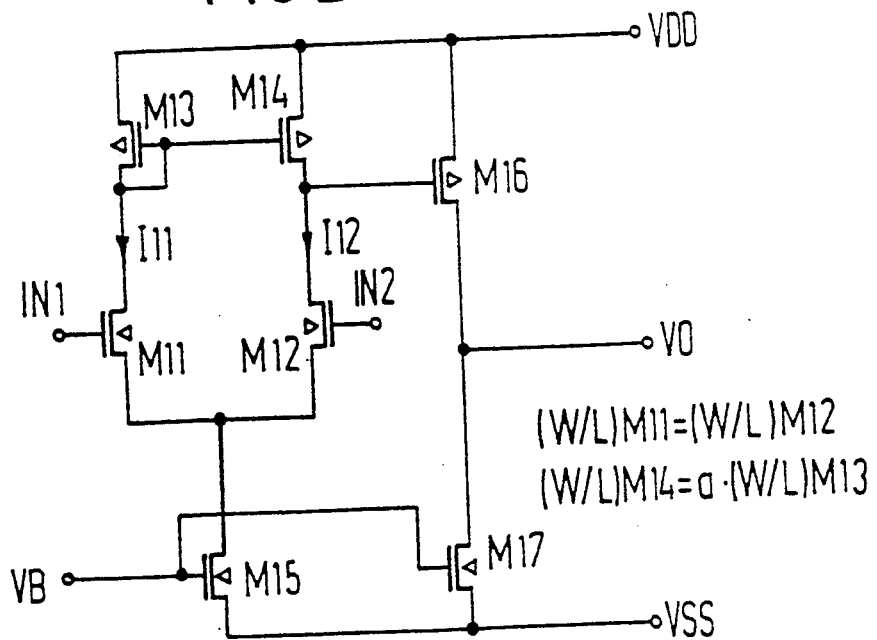

FIG. 1 is a schematic circuit diagram of a first exemplary embodiment of a circuit configuration according to the invention; and FIG. 2 is a circuit diagram of a further exemplary embodiment of a configuration according to the invention.

Referring now in detail to the figures of the drawing in which identical elements are identified by the same reference numerals and first, particularly, to FIG. 1 thereof, it is seen that FIG. 1 is based on a circuit configuration in CMOS technology having a differential comparator and an output driver circuit, such as is described in the publication ICC Berlin Continuing Engineering Education Program, pages 7.4.1–7.4.5. The comparator is formed of transistors M1–M5, which are supplied from a supply voltage source through terminals VDD and VSS. An input differential stage is formed of two input transistors M1 and M2, which are controlled through input terminals IN1 and IN2. The input transistors M1 and M2 are both supplied on the source side from a current source being formed of the transistor M5, which is controlled through a terminal VB with a bias voltage. First and second load transistors M3 and M4 are disposed in the output circuit of the input transistors M1 and M2. The load transistors M3 and M4 are both operated as a load resistor, since the control connections of the two transistors are joined to one another and to the drain terminal of the transistor M3. The output terminal of the differential comparator, which is located at the connecting point between the output circuits of the transistors M2 and M4, controls the output stage of an output driver circuit M6-M9. The output stage includes at least one first output transistor M6 and a second output transistor M7 complementary thereto, which have the output circuits thereof connected in series between the supply voltage terminals. The connecting point of the output circuits of the transistors M6 and M7 forms the output V0 of the circuit configuration. While the transistor M6 is controlled by the output of the comparator, the transistor M7 forms a part of a current mirror, to which a transistor M9 of a reference stage belongs. The control terminals of the transistors M7 and M9 are connected to one another and to the drain terminal of the transistor M9. The output circuit of a reference transistor M8, which is equivalent to the output transistor M6, is connected in series with the output circuit of the transistor M9. Correspondingly, the transistor M8 is controlled by the connecting point of the output circuits of the transistors M1 and M3.

According to the invention, the impressed offset voltage is generated by the selection or dimensioning of the geometrical ratios of the transistors of the circuit configuration. The input transistors M1 and M2 are symmetrically constructed, while the load transistors M3 and M4 are asymmetrical. In accordance with the invention, the geometries of the transistors of the output driver circuit M6-M9 are adapted to the operating characteristic of the differential comparator.

These provisions are attained due to the fact that the geometrical quotients of the channel width and channel length of the transistors are dimensioned accordingly. The ratio of the geometrical quotients of the transistors M1 and M2 is selected to be the same. Since identical structures can be manufactured very precisely in MOS technology, interference brought about by the input stage is largely eliminated in this way. The geometrical quotients of channel width and channel length of the load transistor M4 with respect to the load transistor M3 are set to a value a, which is greater than 1. The magnitude of this value a, together with the transistor constant k for the transistors M1 and M2, which is independent of geometry, determines the magnitude of the offset voltage.

The adaptation of the geometries of the output driver circuit is accomplished by satisfying the following equation:

$$\frac{(W/L)M6}{(W/L)M4} * a = \frac{(W/L)M8}{(W/L)M3} * \frac{(W/L)M7}{(W/L)M9}$$

Inserting the relationship between the value and the transistors M3 and M4 yields the dimensioning rule, i.e., that the geometrical quotient of the output transistor M6 is equal to the product of the geometrical quotients of the reference transistor M8 and the ratio of the geometrical quotients of the output complementary transistor M7 with respect to the reference complementary transistor M9, which form the current mirror as follows:

$$(W/L)M6 = (W/L)M8 * \frac{(W/L)M7}{(W/L)M9}$$

Depending on the dimensioning of the comparator, the current I2 flowing through the transistor M2 is greater than the current I1 flowing through the transistor M1 by the factor a. The sum of the branch currents I1 and I2 results in the bias current furnished by the current source M5. The offset voltage Vd can then be calculated from the relationship for the saturation current of the transistors M1 and M2

$$I = (k/2)*(W/L)*(Vgs - Vt)...$$

The following formula results:

$$Vd = \frac{I1 - I2}{(k/2) * (W/L)}$$

In these formulas, k indicates the transistor constant independent of geometry, and W/L indicates the geometrical quotient of the transistors M1 and M2, while Vgs is the gate-to-source voltage and Vt is the threshold voltage of the transistors.

In the exemplary embodiment of FIG. 2, the invention is explained in terms of a further CMOS circuit configuration, which is known from IEEE Publication ISSC, Vol. Sc-17, No. 6, December 1982, pp. 969-982. The circuit has a differential comparator equivalent to FIG. 1, made up of transistors M11-M15. In contrast to FIG. 1, however, no separate reference stage is provided. Instead, an output complementary transistor M17 and a current source transistor M15, are controlled in common through the terminal VB by a bias voltage. The output of the comparator at the connecting point of the output circuits of the transistors M12 and M14 controls at least one first output transistor M16, the drain terminal of which forms the output of the circuit configuration.

The dimensioning of the geometrical quotients of the comparator transistors is the same as for the comparator transistors of FIG. 1. Thus the geometrical quotient of the channel width and channel length is selected in such a way as to be equal for the transistors M11 and M12. The ratio of the geometrical quotients of the second load transistor M14 relative to the first load transistor M13 is equal to the value a. In order to adapt the output driver circuit formed of the transistor M16 and the transistor M17 complementary thereto, the following condition must also pertain:

$$\frac{(W/L)M16}{(W/L)M14} * a = \frac{(W/L)M17}{(W/L)M15} * (1 + a).$$

After insertion of the ratio indicated for the value a for the transistors M14 and M13, it is found that the ratio of the geometrical quotients of the output transistor M16 to the first load transistor M13 is equal to the product of the ratio of the geometrical quotients of the output complementary transistor M17 and the current source transistor M15, on one hand, and the ratio, increased by 1, of the geometrical quotients of the second load transistor M14 with respect to the first load transistor M13.

The foregoing is a description corresponding in substance to European Application 88 115 835.6, dated Sept. 26, 1988, the International priority of which is being claimed for the instant application, and which is hereby made part of this application. Any material discrepancies between the foregoing specification and the aforementioned corresponding European application are to be resolved in favor of the latter.

I claim:

1. Circuit configuration in complementary MOS technology with transistors having channels, comprising a comparator including two input transistors forming an input differential stage, a current source supplying said input transistors, first and second load transistors being driven by said input transistors, and an output; and an output driver circuit including at leas one first output transistor being controlled by said output of said comparator, and a second output transistor complementary to said at least one first output transistor; said input transistors having symmetrical W/L quotients, wherein W and L represent the width and length respectively of the transistor channels, and said load transistors having asymmetrical W/L quotients generating a given operating characteristic of said comparator, wherein said output driver circuit also includes a reference transistor corresponding to said at least one first output transistor, and a reference complementary transistor forming a current mirror with said second output transistor, and the W/L quotient of said at least one first output transistor is equal to the product of the W/L quotient of said reference transistor and the ratio of the W/L quotients of said current mirror.

2. Circuit configuration according to claim 1, wherein the ratio of the geometrical quotients of the channel width and channel length of said input transistors is equal to 1, and the geometrical quotients of the channel width and channel length of said second load transistor associated with said output, with respect to said first load transistor is greater than 1.

3. Circuit configuration according to claim 2, wherein said output driver circuit also includes a reference transistor corresponding to said at least one first output transistor, and a reference complementary transistor forming a current mirror with said second output transistor, and the geometrical quotient of said at least one first output transistor is equal to the product of the geometrical quotient of said reference transistor and the ratio of the geometrical quotients of said current mirror.

4. Circuit configuration according to claim 2, wherein said current source is formed of a transistor, the ratio of the geometrical quotient of said at least one first output transistor to said first load transistor is equal to the product of the ratio of the geometrical quotients of said second output transistor and said transistor forming said current source, and the ratio of the geometrical quotients of said second and said first load transistors, increased by one.

5. Circuit configuration in complementary MOS technology with transistors having channels, comprising a comparator including two input transistors forming an input differential stage, a current source supplying said input transistors, first and second load transistors being driven by said input transistors, and an output; and an output driver circuit including at least one first output transistor being controlled by said output of said comparator, and a second output transistor complementary to said at least one first output transistor; said input transistors having symmetrical W/L quotients, wherein W and L represent the width and length respectively of the transistor channels, and said load transistors having asymmetrical W/L quotients generating a given operating characteristic of said comparator, wherein said current source is formed of a transistor, the ratio of the W/L quotient of said at least one first output transistor to said second load transistor is equal to the product of the ratio of the W/L quotients of said second output transistor and said transistor forming said current source, and the ratio of the W/L quotients of said first and said second load transistors, increased by one.

* * * * *

UNITED STATES PATENT AND TRADEMARK OFFICE
CERTIFICATE OF CORRECTION

PATENT NO. : 5,043,599

DATED : August 27, 1991

INVENTOR(S) : Heinz Zitta

It is certified that error appears in the above-identified patent and that said Letters Patent is hereby corrected as shown below:

Column 4, line 6,

"$I = (k/2) * (W/L) * (Vgs - Vt)...$"

should read:

-- $I = (k/2) * (W/L) * (Vgs - Vt)^2.$ --

In the Specification, Column 4, line 11,

"$Vd = \dfrac{I1 - I2}{(k/2) * (W/L)}$"

should read:

-- $Vd = \dfrac{\sqrt{I1} - \sqrt{I2}}{\sqrt{(k/2) * (W/L)}}$ --

Signed and Sealed this

Fourth Day of May, 1993

Attest:

MICHAEL K. KIRK

Attesting Officer    Acting Commissioner of Patents and Trademarks